(12) United States Patent
Yilmaz et al.

(10) Patent No.: US 7,768,075 B2
(45) Date of Patent: Aug. 3, 2010

(54) SEMICONDUCTOR DIE PACKAGES USING THIN DIES AND METAL SUBSTRATES

(75) Inventors: Hamza Yilmaz, Saratoga, CA (US); Steven Sapp, Felton, CA (US); Qi Wang, Sandy, UT (US); Minhua Li, Sandy, UT (US); James J. Murphy, South Jordan, UT (US); John Robert Diroll, Sandy, UT (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 11/400,729

(22) Filed: Apr. 6, 2006

(65) Prior Publication Data

US 2007/0235886 A1   Oct. 11, 2007

(51) Int. Cl.
*H01L 27/088* (2006.01)

(52) U.S. Cl. .............. 257/401; 257/329; 257/335; 257/341; 257/691; 257/723; 257/738; 257/772; 257/E27.014; 257/E27.057; 257/E29.027

(58) Field of Classification Search ........... 257/724, 257/692, 730, 773, E23.143, E23.151, 329, 257/331, 332, 335, 341, 691, 728, 287, 328, 257/401, 723, 738, 772, E27.014, E27.057, 257/E29.027; 438/125, 459, 667
See application file for complete search history.

(56) References Cited

U.S. PATENT DOCUMENTS

| 3,617,826 A | 11/1971 | Kobayashi |
| 3,761,782 A | 9/1973 | Youmans |
| 4,205,099 A | 5/1980 | Jones et al. |
| 4,405,932 A | 9/1983 | Ishii et al. |
| 4,416,054 A | 11/1983 | Thomas et al. |
| 4,484,214 A | 11/1984 | Misawa et al. |
| 4,680,613 A | 7/1987 | Daniels et al. |
| 4,720,396 A | 1/1988 | Wood |

(Continued)

FOREIGN PATENT DOCUMENTS

DE   19543540 C1   11/1996

(Continued)

OTHER PUBLICATIONS

Nenadovic et al., A Novel Vertical DMOS Transistor in SOA Technology for RF-power Applications, May 12-15, 2002, pp. 159-162, Proc. 23rd International Conference on Microelectronics (MIEL), vol. 1, NIS, Yugóslavia.

(Continued)

*Primary Examiner*—Julio J Maldonado
(74) *Attorney, Agent, or Firm*—Towsend and Townsend and Crew LLP

(57) ABSTRACT

A semiconductor die package is disclosed. The semiconductor die package comprises a metal substrate, and a semiconductor die comprising a first surface comprising a first electrical terminal, a second surface including a second electrical terminal, and at least one aperture. The metal substrate is attached to the second surface. A plurality of conductive structures is on the semiconductor die, and includes at least one conductive structure disposed in the at least one aperture. Other conductive structures may be disposed on the first surface of the semiconductor die.

9 Claims, 6 Drawing Sheets

U.S. PATENT DOCUMENTS

| | | | |
|---|---|---|---|
| 4,731,701 A | 3/1988 | Kuo et al. |
| 4,751,199 A | 6/1988 | Phy |
| 4,772,935 A | 9/1988 | Lawler et al. |
| 4,791,473 A | 12/1988 | Phy |
| 4,796,080 A | 1/1989 | Phy |
| 4,839,717 A | 6/1989 | Phy et al. |
| 4,890,153 A | 12/1989 | Wu |
| 5,023,196 A | 6/1991 | Johnsen et al. |
| 5,077,229 A | 12/1991 | Forlani |
| 5,134,448 A | 7/1992 | Johnsen et al. |
| 5,143,865 A | 9/1992 | Hideshima et al. |
| 5,155,562 A | 10/1992 | Tsuchiya |
| 5,156,989 A | 10/1992 | Williams et al. |
| 5,216,278 A | 6/1993 | Lin et al. |
| 5,241,133 A | 8/1993 | Mullen, III et al. |
| 5,256,893 A | 10/1993 | Yasuoka |
| 5,297,015 A | 3/1994 | Miyazaki et al. |
| 5,327,325 A | 7/1994 | Nicewarner, Jr. |
| 5,342,797 A | 8/1994 | Sapp et al. |
| 5,352,926 A | 10/1994 | Andrews |
| 5,355,283 A | 10/1994 | Marrs et al. |
| 5,396,403 A * | 3/1995 | Patel .................. 361/705 |
| 5,416,351 A | 5/1995 | Ito et al. |
| 5,430,316 A | 7/1995 | Contiero et al. |
| 5,455,190 A | 10/1995 | Hsu |
| 5,463,241 A | 10/1995 | Kubo |
| 5,467,253 A | 11/1995 | Heckman et al. |
| 5,485,027 A | 1/1996 | Williams et al. |
| 5,539,254 A * | 7/1996 | Eytcheson et al. ........ 257/691 |
| 5,574,301 A | 11/1996 | Blanchard |
| 5,578,841 A | 11/1996 | Vasquez et al. |
| 5,583,376 A | 12/1996 | Sickler et al. |
| 5,589,405 A | 12/1996 | Contiero et al. |
| 5,592,025 A | 1/1997 | Clark et al. |
| 5,646,446 A | 7/1997 | Nicewarner, Jr. et al. |
| 5,674,785 A | 10/1997 | Akram et al. |
| 5,731,709 A | 3/1998 | Pastore et al. |
| 5,734,201 A | 3/1998 | Djennas et al. |
| 5,776,797 A | 7/1998 | Nicewarner, Jr. et al. |
| 5,777,362 A | 7/1998 | Pearce |
| 5,807,783 A | 9/1998 | Gaul et al. |
| 5,831,337 A | 11/1998 | Sato |
| 5,831,832 A | 11/1998 | Gillette et al. |
| 5,841,166 A | 11/1998 | D'Anna et al. |
| 5,841,197 A | 11/1998 | Adamic, Jr. |
| 5,844,168 A | 12/1998 | Schueller et al. |
| 5,856,695 A | 1/1999 | Ito et al. |
| 5,858,815 A | 1/1999 | Heo et al. |
| 5,866,939 A | 2/1999 | Shin et al. |
| 5,866,942 A | 2/1999 | Suzuki et al. |
| 5,866,949 A | 2/1999 | Schueller |
| 5,869,875 A | 2/1999 | Hebert |
| 5,883,432 A | 3/1999 | Higashiguchi |
| 5,883,438 A | 3/1999 | Kang |
| 5,889,332 A | 3/1999 | Lawson et al. |
| 5,892,273 A | 4/1999 | Iwasaki et al. |
| 5,892,288 A | 4/1999 | Muraki et al. |
| 5,965,930 A | 10/1999 | Sakamoto et al. |
| 5,994,739 A | 11/1999 | Nakagawa et al. |
| 6,008,527 A | 12/1999 | Kasahara |
| 6,048,772 A | 4/2000 | D'Anna |
| 6,064,088 A | 5/2000 | D'Anna |
| 6,117,299 A | 9/2000 | Rinne et al. |
| 6,133,634 A | 10/2000 | Joshi |
| 6,198,166 B1 | 3/2001 | Caronati |
| 6,243,818 B1 | 6/2001 | Schwan et al. |
| 6,294,403 B1 | 9/2001 | Joshi |
| 6,303,954 B1 | 10/2001 | Ohoka |
| 6,317,377 B1 | 11/2001 | Kobayashi |
| 6,329,706 B1 | 12/2001 | Nam |
| 6,373,100 B1 | 4/2002 | Pages et al. |
| 6,391,687 B1 | 5/2002 | Cabahug et al. |
| 6,392,290 B1 * | 5/2002 | Kasem et al. ............... 257/678 |
| 6,404,050 B2 | 6/2002 | Davis et al. |
| 6,424,035 B1 | 7/2002 | Sapp et al. |
| 6,432,750 B2 | 8/2002 | Jeon et al. |
| 6,437,981 B1 | 8/2002 | Newton et al. |
| 6,449,174 B1 | 9/2002 | Elbanhawy |
| 6,462,621 B1 | 10/2002 | Charles et al. |
| 6,462,976 B1 | 10/2002 | Olejniczak et al. |
| 6,483,327 B1 | 11/2002 | Bruce et al. |
| 6,489,678 B1 | 12/2002 | Joshi |
| 6,521,982 B1 | 2/2003 | Crowley et al. |
| 6,552,421 B2 | 4/2003 | Kishimoto et al. |
| 6,556,750 B2 | 4/2003 | Constantino et al. |
| 6,566,749 B1 | 5/2003 | Joshi et al. |
| 6,567,261 B2 | 5/2003 | Kanauda et al. |
| 6,570,259 B2 | 5/2003 | Alcoe et al. |
| 6,574,107 B2 | 6/2003 | Jeon et al. |
| 6,580,597 B2 | 6/2003 | Kanoud et al. |
| 6,586,833 B2 | 7/2003 | Baliga |
| 6,608,494 B1 | 8/2003 | Bruce et al. |
| 6,621,152 B2 | 9/2003 | Choi et al. |
| 6,627,991 B1 | 9/2003 | Joshi |
| 6,641,254 B1 | 11/2003 | Boucher et al. |
| 6,642,738 B2 | 11/2003 | Elbanhawy |
| 6,645,791 B2 | 11/2003 | Noquil et al. |
| 6,649,961 B2 | 11/2003 | Estacio et al. |
| 6,653,740 B2 | 11/2003 | Kinzer et al. |
| 6,661,076 B2 | 12/2003 | Toeda et al. |
| 6,661,082 B1 | 12/2003 | Granada et al. |
| 6,664,841 B1 | 12/2003 | Cetin et al. |
| 6,664,848 B1 | 12/2003 | Gist |
| 6,667,557 B2 | 12/2003 | Alcoe et al. |
| 6,673,310 B2 | 1/2004 | Tadauchi et al. |
| 6,674,157 B2 | 1/2004 | Lang |
| 6,683,375 B2 | 1/2004 | Joshi et al. |
| 6,696,321 B2 | 2/2004 | Joshi |
| 6,700,793 B2 | 3/2004 | Takagawa et al. |
| 6,707,138 B2 | 3/2004 | Crowley et al. |
| 6,720,642 B1 | 4/2004 | Joshi et al. |
| 6,731,000 B1 | 5/2004 | Hague et al. |
| 6,731,003 B2 | 5/2004 | Joshi et al. |
| 6,737,887 B2 | 5/2004 | Forbes et al. |
| 6,740,541 B2 | 5/2004 | Rajeev |
| 6,756,689 B2 | 6/2004 | Nam et al. |
| 6,771,052 B2 | 8/2004 | Ostojic |
| 6,774,465 B2 | 8/2004 | Lee et al. |
| 6,777,800 B2 | 8/2004 | Madrid et al. |
| 6,784,537 B2 | 8/2004 | Moriguchi |
| 6,798,180 B2 | 9/2004 | Sase et al. |
| 6,803,659 B2 | 10/2004 | Suwa et al. |
| 6,806,580 B2 | 10/2004 | Joshi et al. |
| 6,830,959 B2 | 12/2004 | Estacio |
| 6,836,023 B2 | 12/2004 | Joshi et al. |
| 6,842,346 B2 | 1/2005 | Takagawa et al. |
| 6,867,481 B2 | 3/2005 | Joshi et al. |
| 6,867,489 B1 | 3/2005 | Estacio |
| 6,872,465 B2 | 3/2005 | Soga et al. |
| 6,879,137 B2 | 4/2005 | Sase et al. |
| 6,879,491 B2 | 4/2005 | Jauregui |
| 6,882,170 B2 | 4/2005 | Eiles et al. |
| 6,891,256 B2 | 5/2005 | Joshi et al. |
| 6,891,257 B2 | 5/2005 | Chong et al. |
| 6,893,901 B2 | 5/2005 | Madrid |
| 6,900,650 B1 | 5/2005 | Sheng et al. |
| 6,930,397 B2 | 8/2005 | Standing et al. |
| 6,943,434 B2 | 9/2005 | Tangpuz et al. |
| 6,946,740 B2 | 9/2005 | Schaffer |
| 6,949,822 B2 | 9/2005 | Shivkumar et al. |
| 6,963,136 B2 | 11/2005 | Shinozaki et al. |
| 6,967,412 B2 | 11/2005 | Standing |
| 6,969,909 B2 | 11/2005 | Briere |
| 6,989,588 B2 | 1/2006 | Quinones et al. |

| | | | |
|---|---|---|---|
| 6,992,384 B2 | 1/2006 | Joshi | |
| 7,019,362 B2 | 3/2006 | Sakamoto et al. | |
| 7,022,548 B2 | 4/2006 | Joshi et al. | |
| 7,023,077 B2 | 4/2006 | Madrid | |
| 7,023,706 B2 | 4/2006 | Negishi et al. | |
| 7,038,917 B2 | 5/2006 | Vinciarelli et al. | |
| 7,061,077 B2 | 6/2006 | Joshi | |
| 7,061,080 B2 | 6/2006 | Jeun et al. | |
| 7,081,666 B2 | 7/2006 | Joshi et al. | |
| 7,364,949 B2 * | 4/2008 | Standing | 438/121 |
| 2002/0050407 A1 * | 5/2002 | Sohn et al. | 174/262 |
| 2002/0081773 A1 | 6/2002 | Inoue et al. | |
| 2002/0185710 A1 * | 12/2002 | Zandman et al. | 257/620 |
| 2004/0169266 A1 * | 9/2004 | Maxwell | 257/684 |
| 2005/0133893 A1 | 6/2005 | Joshi et al. | |
| 2005/0161785 A1 * | 7/2005 | Kawashima et al. | 257/678 |
| 2006/0003551 A1 | 1/2006 | Mancini et al. | |
| 2006/0071271 A1 * | 4/2006 | Omura et al. | 257/341 |
| 2007/0020884 A1 | 1/2007 | Wang et al. | |

FOREIGN PATENT DOCUMENTS

| | | |
|---|---|---|
| DE | 19907525 A1 | 8/2000 |
| EP | 0926723 A1 | 6/1999 |
| WO | WO 99/57761 A1 | 11/1999 |

OTHER PUBLICATIONS

Baliga; "Trends in Power Semiconductor Devices"; 1996, *IEEE Transactions on Electron Devices*, vol. 43, No. 10, pp. 1717-1731.

Chang, E.Y. et al.; "A Hybrid Wafer-Dicing Process for GaAs MMIC Production"; 1991, *IEEE Transactions on Semiconductor Manufacturing*, vol. 4, No. 1, pp. 66-68.

Gupta, A. et al.; "Yield Considerations for Ion-Implanted GaAs MMIC's"; 1983, *IEEE Transactions on Electron Devices*, vol. 30, No. 1, pp. 16-20.

Sumitani, K. et al.; "A High Aspect Ratio Via Hole Dry Etching Technology for High Power GaAs MESFET"; 1989, *Proceedings of the Gallium Arsenide Integrated Circuit Symposium*, vol. 11, pp. 207-210.

Search/Examination Report dated Oct. 30, 2009 from Chinese Patent Application No. 200780011769.1, with an English translation, 15 pages.

* cited by examiner

SEMICONDUCTOR DIE PACKAGES USING THIN DIES AND METAL SUBSTRATES

CROSS-REFERENCES TO RELATED APPLICATIONS

None.

BACKGROUND OF THE INVENTION

As power semiconductor devices have evolved and on-resistance has decreased, the contribution of the substrate layer in a semiconductor die to the total resistance has grown. One way to further reduce the on-resistance in a power semiconductor device is to use a thinner semiconductor die. Also, thin semiconductor dies dissipate heat better than thicker semiconductor dies.

U.S. patent application Ser. No. 11/189,163, filed on Jul. 25, 2005, entitled "Semiconductor Structures Formed On Substrates And Methods of Manufacturing The Same", by Qi Wang, et al. describes a method for producing a thin semiconductor die. The described method includes transferring a thin doped substrate layer to a handle wafer with an oxide interposer layer. The thin substrate layer (1-3 microns) can be processed by standard methods, including epi (epitaxial) deposition. The handle wafer is eventually replaced by a thick metal substrate to eliminate the normal semiconductor substrate contribution to the on-state resistance of formed devices. The resulting structure can then be segmented into chips that can be incorporated into conventional semiconductor die packages.

Embodiments of the invention provide for semiconductor die packages that are particularly suitable for use with the above-described semiconductor dies. However, embodiments of the invention need not be exclusively used with the above-described semiconductor dies. As will be described in further detail below, the semiconductor die packages according to embodiments of the invention can provide for lower on-resistance and better heat dissipation properties than conventional semiconductor die packages.

Embodiments of the invention address the above problems, and other problems, individually and collectively.

SUMMARY OF THE INVENTION

Embodiments of the invention are directed to semiconductor die packages and methods for making the same.

One embodiment of the invention is directed to semiconductor die package. The semiconductor die package comprises a metal substrate, and a semiconductor die comprising a first surface comprising a first electrical terminal, a second surface including a second electrical terminal, and at least one aperture. The metal substrate is attached to the second surface. A plurality of conductive structures is on the semiconductor die, and includes at least one conductive structure disposed in the at least one aperture. Other conductive structures may be disposed on the first surface of the semiconductor die.

Another embodiment of the invention is directed to a method for forming a semiconductor die package. The method comprises obtaining a semiconductor die comprising a first surface comprising a first electrical terminal, and a second surface including a second electrical terminal. The metal substrate is attached to the second surface of the semiconductor die, and at least one aperture is formed in the semiconductor die, thereby exposing a portion of a surface of the metal substrate. At least one conductive structure is deposited in the at least one aperture, where the at least one conductive structure is in electrical communication with the metal substrate.

Other embodiments of the invention are directed to electrical assemblies incorporating the semiconductor die packages according to embodiments of the invention, as well as methods for forming such electrical assemblies.

These and other embodiments of the invention are described in further detail below.

BRIEF DESCRIPTION OF THE DRAWINGS

FIG. 1(c) specifically shows a specific semiconductor die package embodiment that includes solder bumps.

Figure 1A:
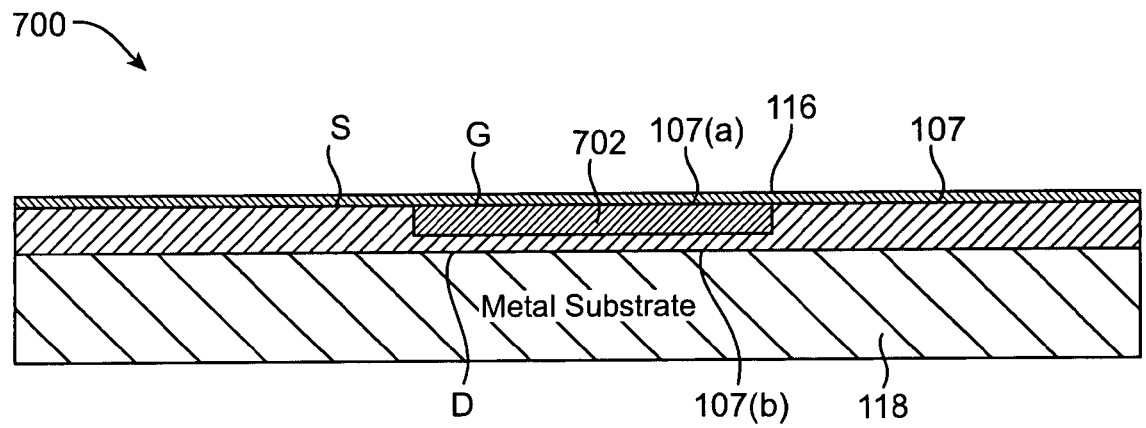
FIGS. 1(a)-1(c) show cross-sections of a semiconductor die package according to an embodiment of the invention as it is being formed.

These and other embodiments of the invention are described in further detail below with reference to the Detailed Description. Also, for clarity of illustration, some features in the Figures may not be drawn to scale.

DETAILED DESCRIPTION

Embodiments of the invention are directed to semiconductor die packages and methods for making semiconductor die packages. In one embodiment, a semiconductor die package according to an embodiment of the invention includes a metal substrate, and a semiconductor die including a first surface including a first electrical terminal, a second surface including a second electrical terminal, and at least one aperture. The first and second terminals could be input (e.g., source or gate) or output (e.g., drain) terminals, respectively. The metal substrate is attached to the second surface of the semiconductor substrate. Conductive structures including first and second conductive structures are on the semiconductor die. At least one first conductive structure is disposed in the at least one aperture in the semiconductor die. At least one second conductive structure is disposed on the first surface of the semiconductor die. The first and second conductive structures may include the same or different types of conductive materials.

Some embodiments of the invention can be described with reference to FIGS. 1(a)-1(c). In these embodiments, a finished ultra-thin wafer device (UTW) is produced according to the method described in U.S. patent application Ser. No. 11/189,163, which is herein incorporated by reference in its entirety for all purposes. At an appropriate time in the process flow, additional processing occurs from the top of a semiconductor die to remove a portion of the semiconductor die overlying a relatively thick metal substrate that is under and attached to the semiconductor die. (The semiconductor die is typically present with other semiconductor dies in an array in a semiconductor wafer.) As a result, one or more apertures are formed in the semiconductor die. After processing, the surface of the metal substrate may be exposed through the apertures.

After forming one or more apertures in the semiconductor die, solder balls, or other conductive structures (e.g. copper studs), are deposited on the surface of the semiconductor die and within the one or more apertures. This provides a topside connection to the backside metal substrate as shown in FIG. 1(c).

The resulting package is a completed power semiconductor die package, and can have a configuration similar to a MOSFET BGA type semiconductor die package (see, e.g., U.S. Pat. No. 6,133,634). However, unlike a conventional MOSFET BGA type semiconductor package, the metal substrate in the invention embodiment is attached to a semiconductor die during the processing of the wafer which contains the semiconductor die. This reduces the cost associated with handling individual semiconductor dies and packaging them. Furthermore, the semiconductor substrate resistance is eliminated so that the performance is improved, and the formed package is even smaller than a conventional MOSFET BGA type semiconductor package. Further details are provided below with reference to FIGS. 1(a)-1(c).

FIG. 1(a) shows an intermediate structure 700 comprising a semiconductor die 107. The intermediate structure 700 can be formed by the process that is described in U.S. patent application Ser. No. 11/189,163, which is herein incorporated by reference in its entirety for all purposes. One intermediate structure 700 is shown for clarity of illustration. It is understood that the intermediate structure 700 shown in FIG. 1(a) may be one of many intermediate structures in an array of semiconductor dies in a single semiconductor wafer that is being processed.

The semiconductor die 107 has a first surface 107(a) and a second surface 107(b). The second surface 107(b) of the semiconductor die 107 is attached to a metal substrate 118. The metal substrate 118 may have been previously laminated to the semiconductor die 107. Alternatively, the metal substrate 118 can be deposited on the semiconductor die through some other process (e.g., vapor deposition, electroplating and low temperature thermal bonding).

A metal layer 116 is on the first surface 107(a) of the semiconductor die 107. The metal layer 116 may include any suitable material. For example, the metal layer 116 may comprise a solderable metal material such as an underbump metallurgy combination. An underbump metallurgy combination is a stack of metal that is used in a solder bump process. The stack may include at least two of an adhesion layer, a diffusion barrier, a wetting layer, and an oxidation protection layer. The metal layer 116 may also have any suitable thickness. The metal layer 116 may be formed using any suitable process including vapor deposition, electroplating, etc.

The semiconductor die 107 may have any suitable thickness. For example, the semiconductor die 107 may have a thickness that is less than about 50 microns, and preferably less than about 30 microns (e.g., 10 to 30 microns thick) in some embodiments of the invention. As explained above, thinner semiconductor dies provide for lower on-resistance properties as well as better thermal dissipation properties.

The first surface 107(a) of the semiconductor die 107 may coincide with a first electrical terminal, and the second surface 107(b) of the semiconductor die 107 may coincide with a second electrical terminal. The first electrical terminal may be an input terminal, while the second electrical terminal may be an output terminal. For example, the first electrical terminal at the first surface 107(a) may be a source terminal S or a gate terminal G in a power MOSFET, while the second terminal may be a drain terminal D in the power MOSFET at the second surface 107(b). There may be additional terminals at the first and second surfaces 107(a), 107(b) in addition to the first and second terminals.

In FIG. 1(a), a gate structure 702 is shown in the semiconductor die 107. The gate structure 702 may be in the form of a filled trench, and the trench may be filled with a conductive material such as doped polysilicon or metal, and may have a corresponding gate terminal G that coincides with the first surface 107(a) of the semiconductor die 107.

The first and second terminals may also form terminals in a functioning semiconductor device. Suitable semiconductor devices include vertical devices including power MOSFETs, IGBTs, bipolar power transistors, etc. Other devices including power RF LDMOS devices, MMIC, and other IC devices (that depend on low ground loop inductance and resistance) could benefit from this package concept by providing interconnects that directly connect to a ground plane. RF LDMOS devices, in particular, utilize source to substrate interconnects for this purpose. Such interconnects could be replaced by direct interconnects to the ground, thus improving the performance of this class of devices in RF power transmission applications.

The metal substrate 118 may have any suitable properties and may have any suitable configuration. For example, the metal substrate 118 may comprise a metal such as copper, aluminum, noble metals, and alloys thereof. The metal substrate 118 is preferably thick, relative to the semiconductor die 107. For example, the thickness of the metal substrate 118 may be greater than about 5 microns, and preferably greater than about 100 microns thick (e.g., 100-200 microns thick) in some embodiments. As illustrated by these examples, the metal substrate is preferably thicker than the semiconductor die 107.

Figure 1B:
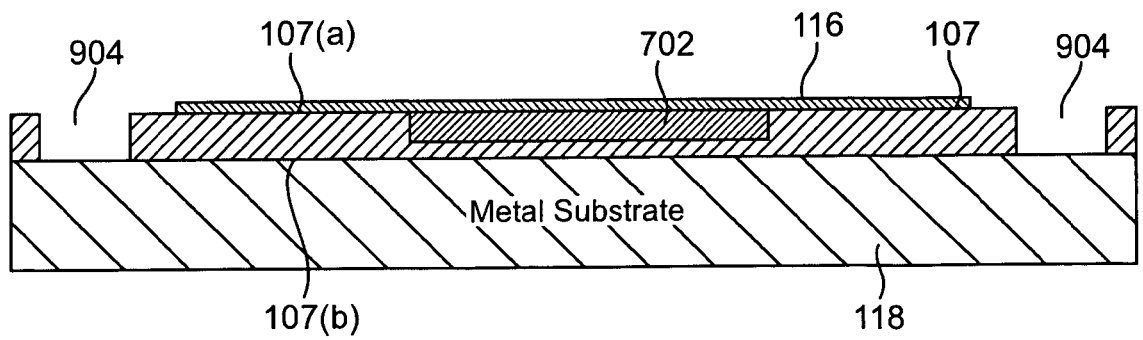

As shown in FIG. 1(b), after obtaining the intermediate structure 700 shown in FIG. 1(a), the semiconductor die 107 is etched to form apertures 904 at pre-selected locations. The apertures 904 may have any suitable dimensions, or shape, and may be formed using any known material removal process including etching (wet or dry), milling, etc. After forming the apertures 904 in the semiconductor die 107, at least a portion of a surface of the metal substrate 118 is exposed through the apertures 904. Any suitable number of apertures 904 may be formed in the semiconductor die 107.

Figure 1C:
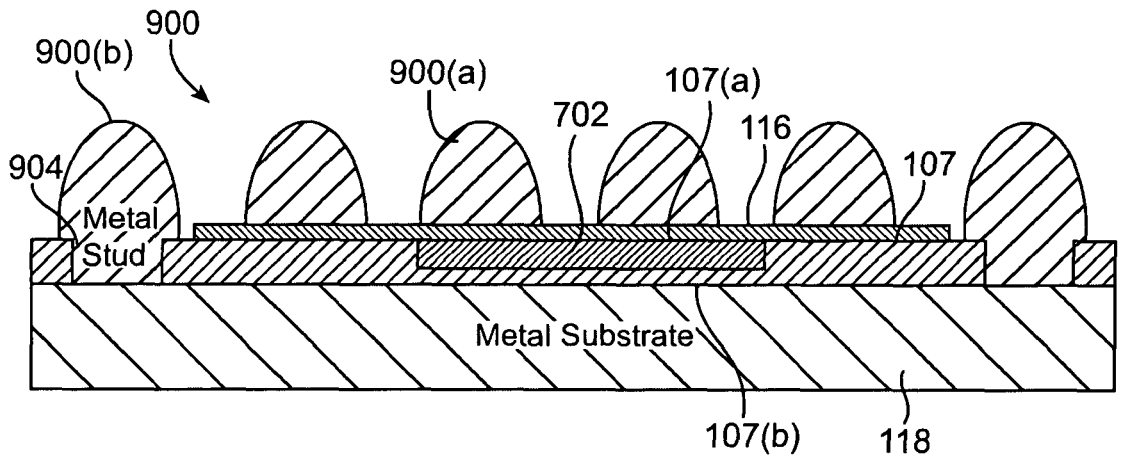
Figure 1D:
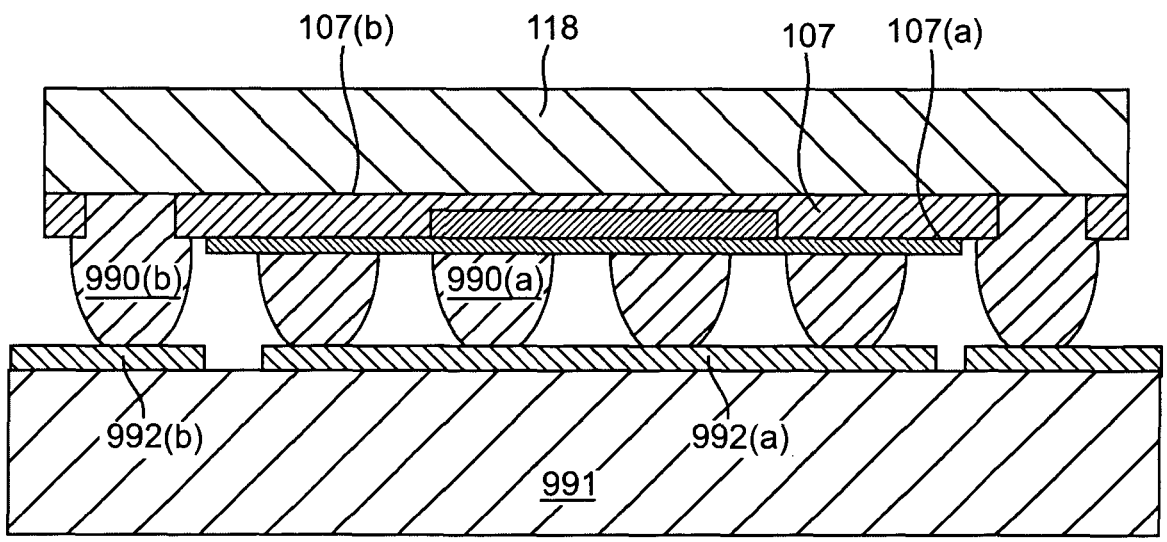
FIG. 1(d) shows the package shown in FIG. 1(c) mounted to a printed circuit board.

As shown in FIG. 1(c), conductive structures 900 are deposited on the metal substrate 118 and the semiconductor die 107. The conductive structures 900 include at least one first conductive structure 900(a), and at least one second conductive structure 900(b).

The conductive structures 900 may comprise any suitable material, and may be in any suitable form (e.g., columns, balls, and structures with flat and/or rounded surfaces). Suitable materials include solder (lead based and lead free), and conductive metals such as copper. If the conductive structures 900 include solder, then solder reflow processes that are known in the art can be used.

The conductive structures 900 may also be formed using any suitable process. For example, screen printing processes, vapor deposition processes, electroplating processes, pick and place processes, etc. may be used to form the conductive structures 900.

As shown in FIG. 1(*d*), once the semiconductor die package shown in FIG. 1(*c*) is formed, it can be flipped over and mounted to a circuit board 990 to form an electrical assembly. The circuit board 990 includes a dielectric layer 991 and conductive pads 992(*a*), 992(*b*). Suitable circuit boards are known in the art and may include any number of conductive pads, lines, and layers, and any number of dielectric layers.

The first surface 107(*a*) of the semiconductor die 107 would face toward the circuit board 990 while the second surface 107(*b*) would face away from the circuit board. In the electrical assembly, the first conductive structures 900(*a*) could serve as input connections for a semiconductor device (e.g., a power MOSFET) in the semiconductor die 107, while the second conductive structures 900(*b*) may serve as output connections for the semiconductor device. Input current can flow from the conductive pad 992(*a*) on the circuit board 990 to the first conductive structures 900(*a*) and to the die 107. Output current can be routed from the second surface 107(*b*) of the semiconductor die 107 to the metal substrate 118, to the second conductive structures 900(*b*), and to conductive pads 992(*b*) on the circuit board 990. The metal substrate 118 and the thinner semiconductor die 107 provide the resulting semiconductor die package with lower on-resistance and better thermal dissipation properties.

In other embodiments, the package shown in FIG. 1(*c*) need not be flipped over and mounted to a circuit board. For example, the package could be mounted so that metal substrate 118 is attached to and faces the circuit board 990. The conductive structures 900 on the other side of the package could be electrically coupled to conductive pads on the circuit board using wires, leadframes, or other conductive bodies.

Figure 2:
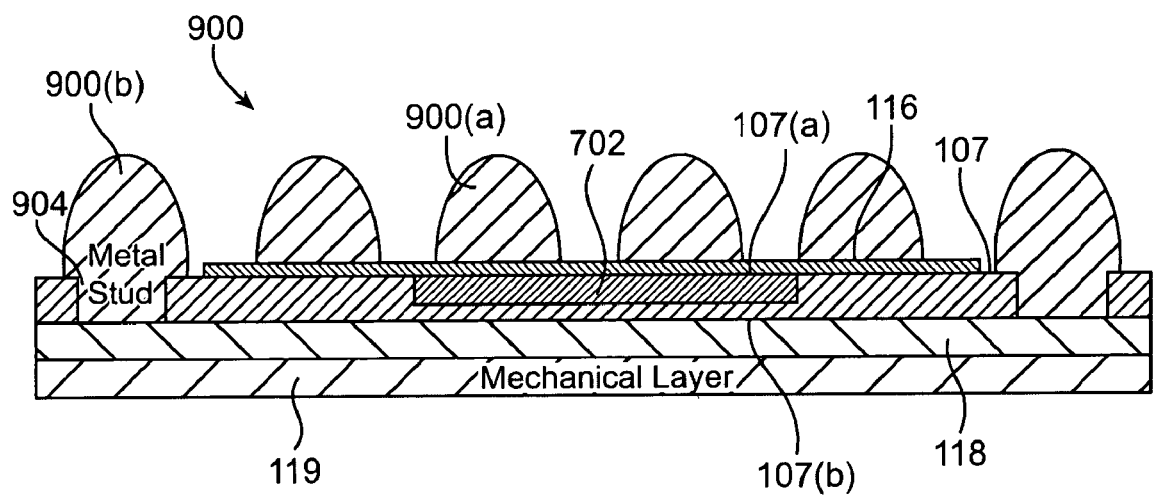
FIG. 2 shows a side, cross-sectional view of a another semiconductor die package according to another embodiment of the invention with a reinforcing mechanical layer.

FIG. 2 shows another embodiment of the invention. In FIGS. 1(*c*) and 2, like numerals designate like elements. The configuration shown in FIG. 2 is similar to the configuration in FIG. 1(*c*). However, in FIG. 2, the metal substrate 118 is thinner (e.g., less than 10 microns thick, or between about 5-10 microns in thickness) than the substrate 118 that is shown in FIG. 1(*c*). In addition, an additional mechanical layer 119 is on the metal substrate 118. The mechanical layer 119 mechanically supports the semiconductor die 107 and the metal substrate 118. The CTE (coefficient of thermal expansion) of the mechanical layer 119 can be chosen so that is substantially matches that of the semiconductor die 107.

The mechanical layer 119 can have any suitable predetermined thermal, electrical, and mechanical properties. For example, the mechanical layer may comprise an insulating material that has high thermal conductivity (e.g., ceramic). A heat sink can also be directly attached to the mechanical layer 119 if desired.

The semiconductor die package shown in FIG. 2 has a number of advantages. For example, the semiconductor die package is rigid and thin so that the overall thickness of the package can be reduced. Also, since the metal substrate 118 has a reduced thickness, costs may also be reduced, relative to the embodiment shown in FIG. 1(*c*).

Figure 3:
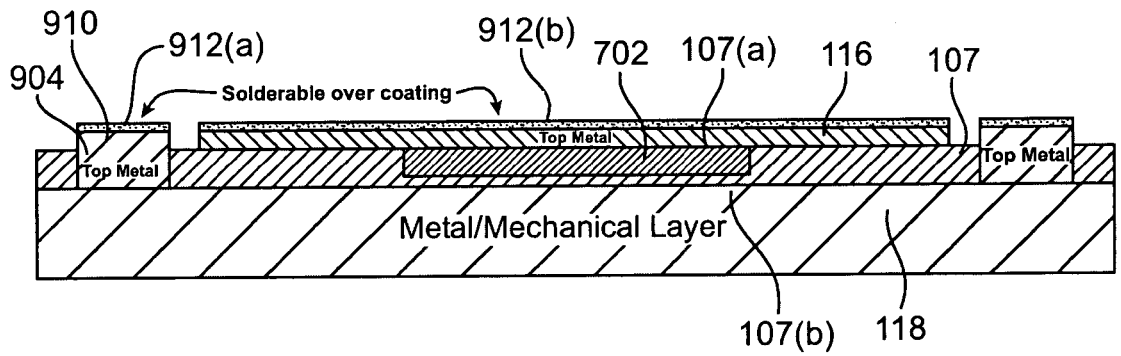
FIG. 3 shows a side, cross-sectional view of another semiconductor die package according to another embodiment of the invention with plated metal layers.

FIG. 3 shows another embodiment of the invention. In FIGS. 1(*c*) and 3, like numerals designate like elements. The package shown in FIG. 3 can be connected to external leads with wire bonds, clips, or ribbon connectors, or it could be flipped over and mounted to a circuit board or the like.

In the embodiment shown in FIG. 3, a topside metal (e.g., aluminum) layer 116 is on the semiconductor die 107. Plated metal 910 fills the apertures 904 instead of solder as in the embodiment in FIG. 1(*c*). Solderable top surface over coatings 912(*a*), 912(*b*) are in contact with and are disposed over the topside metal layer 116 and plated metal 910. If desired, the top solderable surface over coatings 912(*a*), 912(*b*), and/or the topside metal layer 116 and the plated metal 910 can also be planarized using conventional techniques (e.g., CMP or chemical mechanical polishing), if desired. The plated metal 910 could alternatively be formed using other deposition processes such as CVD, PVD, etc. The plated metal 910 may also comprise any suitable metal including copper, aluminum, tungsten, alloys thereof, etc. In addition, although only two plated metal vias are shown in FIG. 3, embodiments of the invention can have more vias, if desired.

In the embodiment shown in FIG. 3, electrical connections to the metal substrate 118 can be formed by plating or otherwise depositing metal within the apertures 904. When the package is mounted to a circuit board, the plated metal 910 could be used in combination with solder balls or metal studs to join the package to the circuit board.

Figure 4:
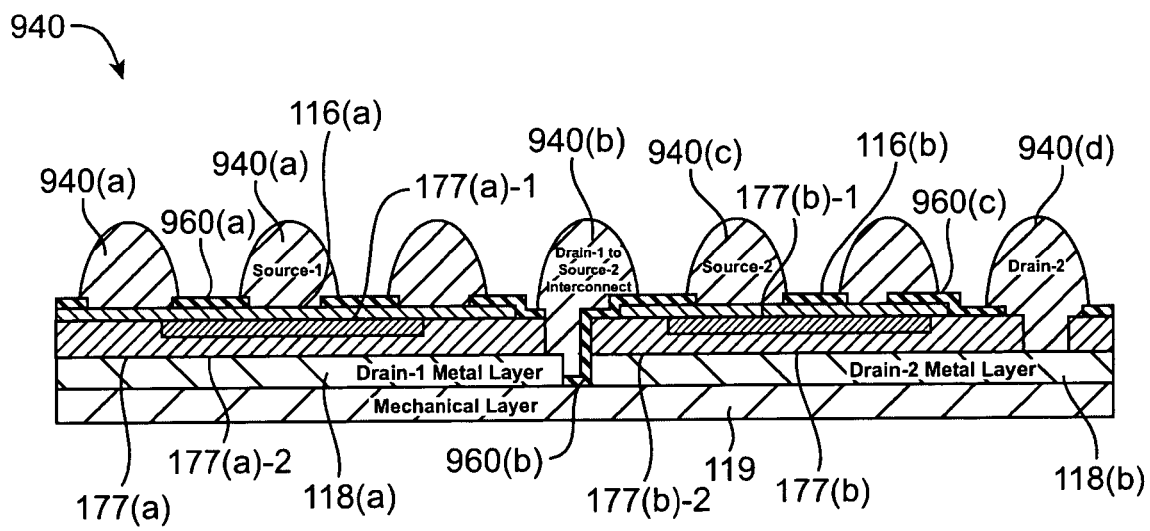
FIG. 4 shows a side, cross-sectional view of another semiconductor die package according to another embodiment of the invention including two semiconductor dies. The semiconductor die package can be used in a synchronous buck converter circuit.

FIG. 4 shows another semiconductor die package according to an embodiment of the invention. The semiconductor die package can provide for a single package solution in a synchronous buck converter application. Synchronous buck converter systems are described in U.S. Pat. No. 6,806,580, which is herein incorporated by reference in its entirety for all purposes. The semiconductor die package can also be attached to a heat sink (not shown), if desired. The package shown in FIG. 4 may be characterized as having an "H-bridge" configuration.

In the semiconductor die package embodiment shown in FIG. 4, there are first and second semiconductor dies 177(*a*), 177(*b*) disposed on metal substrates 118(*a*), 118(*b*). The first and second semiconductor dies 177(*a*), 177(*b*), can have respective first surfaces 177(*a*)-1, 177(*b*)-1, and second surfaces 177(*a*)-2, 177(*b*)-2. As in the prior embodiments, metal layers 116(*a*), 116(*b*) may be disposed on the first surfaces 177(*a*)-1, 177(*b*)-1 of the first and second semiconductor dies 177(*a*), 177(*b*). The metal layers 116(*a*), 116(*b*) may comprise solderable metals. A single mechanical layer 119 may support both of the metal substrates 118(*a*), 118(*b*).

The semiconductor die package shown in FIG. 4 includes a plurality of conductive structures 940 on the first and second semiconductor dies 177(*a*), 177(*b*). The plurality of conductive structures 940 includes a first plurality of conductive structures 940(*a*), at least a second conductive structure 940(*b*), a plurality of third conductive structures 940(*c*), and at least a fourth conductive structure 940(*d*). The first, second, third, and fourth conductive structures 940(*a*)-(*d*) may comprise any suitable material and may be formed using any suitable process. Exemplary materials and processes are described above.

The semiconductor die package shown in FIG. 4 also comprises a number of dielectric layers 960(*a*), 960(*b*), 960(*c*). The first dielectric layer 906(*a*) can isolate regions where the first plurality of conductive structures 940(*a*) reside from adjacent conductors. The second dielectric layer 906(*b*) can electrically isolate the second conductive structure 940(*b*), from drain current flowing in the second semiconductor die 177(*b*) and the second metal substrate 118(*b*). A third dielectric layer 960(*c*) can isolate the third and fourth conductive structures 940(*c*), 940(*d*) from each other and other conductors The first, second, and third dielectric layers 960(a), 960(b), 960(c) may comprise any suitable dielectric material, may have any suitable thickness, and may be formed using any suitable process (e.g., chemical vapor deposition, spin coating and curing, etc., along with suitable lithography processes known in the art). For example, the dielectric layers 960(a), 960(b), 960(c) may comprise an insulating, patternable polymeric material such as polyimide.

Once the semiconductor die package shown in FIG. 4 is formed, it can be flipped over and mounted to a circuit board or the like to form an electrical assembly. In the electrical assembly, the first plurality of conductive structures 940(a) can serve as source inputs to source terminals at the first surface 177(a)-1 of the first semiconductor die 177(a) (a gate input is not shown). Drain current from the second surface 177(a)-2 of the first semiconductor die 177(a) can flow to the first metal substrate 118(a), to the second conductive structure 940(b), and to a pad on the circuit board (not shown) which electrically couples the second conductive structure 940(b) to the third conductive structures 940(c). The current then flows to the source terminals at the first surface 177(b)-1 of the second semiconductor die 177(b) via the third conductive structures 940(c). Drain current from the second semiconductor die 177(b) then flows to the second metal substrate 118(b), to the fourth conductive structure 940(d), and to an output conductive pad on the circuit board (not shown).

If the first and second semiconductor dies 177(a), 177(b) include high and low side MOSFETs (typically in a synchronous buck converter circuit), the second conductive structure 940(b) may serve as a connection between the drain in one MOSFET to the source in the other MOSFET. (The gate connections to the first and second semiconductor dies 177(a), 177(b) are not shown in FIG. 4.)

Figure 5:
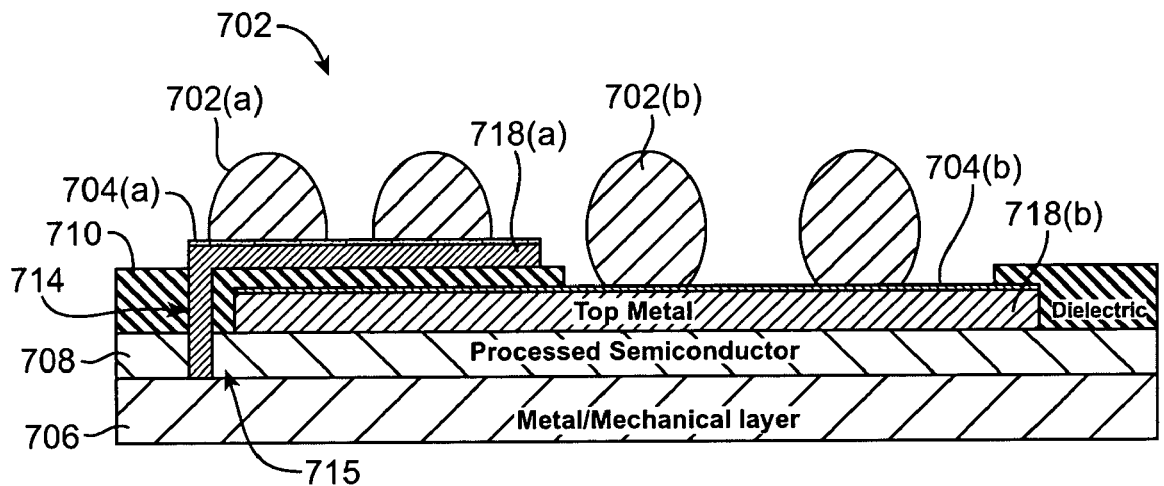
FIG. 5 shows a side, cross-sectional view of a semiconductor die package according to an embodiment of the invention. In this example, the package includes first and second metal layers respectively connected to input and output terminals of a device in a semiconductor die. The first and second metal layers overlap.
Figure 6:
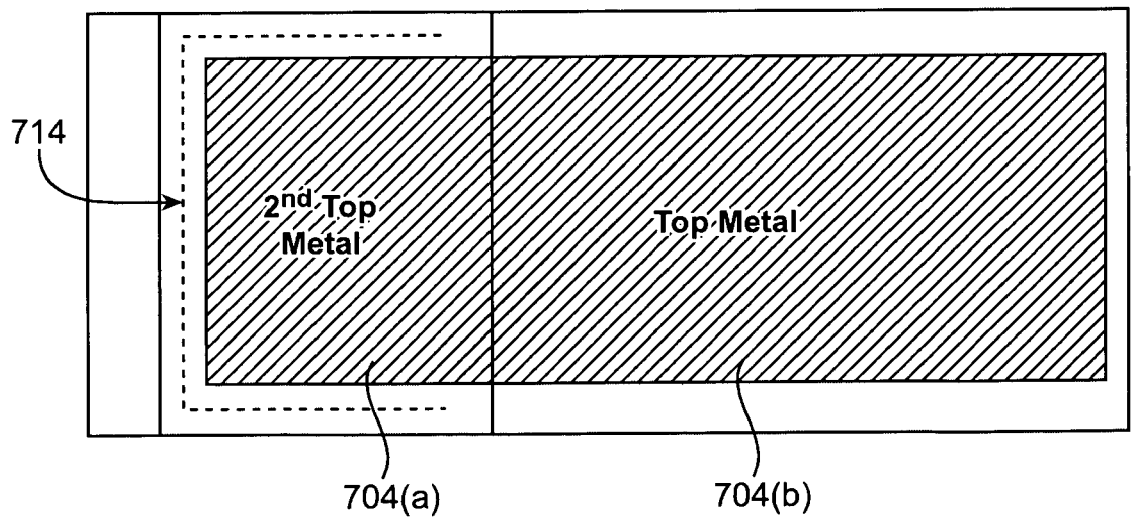
FIG. 6 shows a top view of the semiconductor die package shown in FIG. 5.

FIGS. 5 and 6 show another semiconductor die package according to another embodiment of the invention. As shown in FIGS. 5 and 6, the size (lateral dimensions) of a semiconductor die package can be further reduced by reducing the dimension of the top metal connection to the backside metal/mechanical layer and increasing the number of connections. "Vias" are created to the backside metal/mechanical layer as in prior embodiments. The connection to the backside can then be made above a top metal layer upon an insulating dielectric film, which is on a semiconductor die. This reduces the size of the semiconductor die package. The size and quantity of the vias can also be altered to meet electrical current demands. By having multiple connections, the reliability of the connection to the semiconductor die package is increased.

Referring to FIG. 5, as in prior embodiments, a semiconductor die 708 is attached to a metal substrate 706. An aperture 715 is formed in the semiconductor die 708 as previously described. A second metal layer 718(a) is formed over a first metal layer 718(b) on the semiconductor die 708, and a second solderable metal layer 704(a) is formed on a second metal layer 718(b). A dielectric layer 710 is also formed on the semiconductor die 708 and the first metal layer 718(b). The dielectric layer 710 may be formed from polyimide or the like. A conductive via 714 is formed in the aperture 715, and connects second top metal layer 718(a) to the metal substrate 706. A first solderable metal layer 704(b) may also be formed on the first metal layer 718(b).

As in prior embodiments, a plurality of conductive structures 702 is on the semiconductor die 708. The plurality of conductive structures 702 includes a first plurality of conductive structures 702(a) electrically coupled to the metal substrate 706, and a second plurality of conductive structures 702(b) electrically coupled to the top of the semiconductor die 708. The first plurality of conductive structures 702(a) can provide a drain output for a MOSFET in the semiconductor die 708, while the second plurality of conductive structures 702(b) can provide a source input for the MOSFET in the semiconductor die 702.

As shown, the first plurality of conductive structures 702(a) overlap with a portion of the semiconductor die 708, thereby reducing the lateral dimensions of the formed package and providing for a greater number of input and/or output terminals for the semiconductor package.

FIG. 6 shows a top view of the semiconductor die package shown in FIG. 6. The vias 714 are shown. As shown, the second solderable metal layer 704(a) overlies the first solderable metal layer 704(b). In FIG. 6, as in FIG. 5, the first metal layer 718(a) would be connected to the metal mechanical layer 706 through the vias 714. In FIG. 6, the first metal layer 718(a) and the metal mechanical layer 706 are not shown.

In preferred embodiments, the application of any solderable layers could be postponed until after any base conductive (aluminum) layers are in place.

Figure 7:
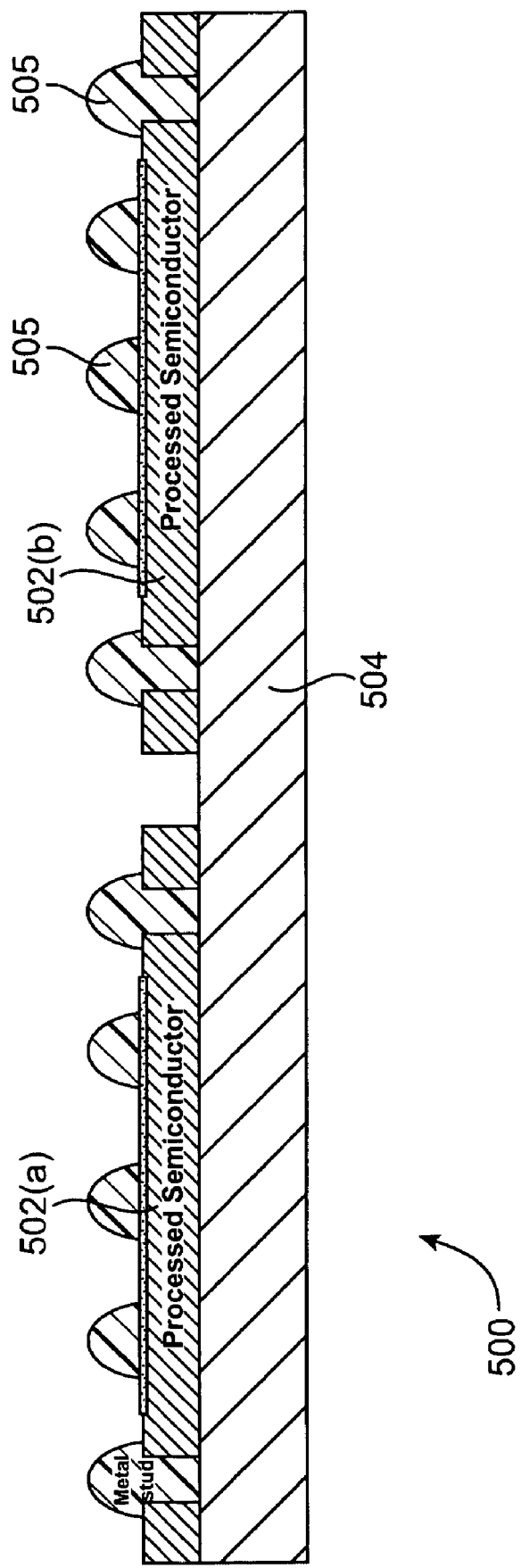
FIG. 7 shows a side cross-sectional view of another semiconductor die package embodiment. The semiconductor die package embodiment has a metal substrate that serves as a common output for two semiconductor dies attached to the metal substrate. The two semiconductor dies may or may not be the same type. They could have different performance properties, where their combination would provide the most desirable effect.

FIG. 7 shows another embodiment of the present invention. In FIG. 7, the configuration 500 is similar to the configuration shown in FIG. 1(c), however, in FIG. 7, a backside metal substrate 504 can be used as a common conduit for a common drain dual die application. As shown, two semiconductor dies 502(a), 502(b) are mounted on a metal substrate 504. The substrate 504 can form a common output (e.g., a common drain) terminal for the semiconductor devices in the semiconductor dies 502(a), 502(b). The semiconductor dies 502(a), 502(b) would be processed as previously described and the conductive structures 505 would be formed on the semiconductor dies 502(a), 502(b) as previously described. However, instead of sawing the dies individually to separate them from each other during a wafer dicing process, the sawing process would be modified to result in pairs of die connected by the common metal layer. In other embodiments, the dicing process may use a grinding process instead.

Embodiments of the invention have a number of advantages. First, the semiconductor die packages according to embodiments of the invention are small and may be used in chip scale packages (CSPs). Second, because the packages can be formed using thin semiconductor dies, the packages have low on resistance and inductance properties and good thermal dissipation properties. Third, since the packaging formation process occurs when the dies are present in a semiconductor wafer, costs are reduced since each die need not be individually manipulated for packaging.

The above description is illustrative and is not restrictive. Many variations of the invention will become apparent to those skilled in the art upon review of the disclosure. The scope of the invention should, therefore, be determined not with reference to the above description, but instead should be determined with reference to the pending claims along with their full scope or equivalents.

One or more features from any embodiment may be combined with one or more features of any other embodiment without departing from the scope of the invention. For example, a mechanical layer and metal substrate combination is shown in FIG. 2. This combination can be used in any of the embodiments shown in the other Figures in this application.

A recitation of "a", "an" or "the" is intended to mean "one or more" unless specifically indicated to the contrary. In addition, words such as "over", "under", etc. are used to described features as they are shown in the Figures and may or may not refer to absolute positions when the semiconductor die packages according to embodiments of the invention are made or used.

All patents, patent applications, publications, and descriptions mentioned above are herein incorporated by reference in their entirety for all purposes. None is admitted to be prior art.

What is claimed is:

1. A semiconductor die package comprising:
   a planar metal substrate within the semiconductor die package;
   a semiconductor die comprising a first surface comprising a first electrical terminal, a second surface including a second electrical terminal, and at least one aperture extending through the semiconductor die, wherein the metal substrate is attached to the second surface and exposed by the at least one aperture, wherein the semiconductor die has a thickness of about 30 microns or less; and
   a plurality of solder structures on the semiconductor die, wherein the plurality of solder structures includes at least one first solder structure disposed on the first surface of the semiconductor die, and at least one second solder structure disposed in the at least one aperture,
   wherein the at least one second solder conductive structure is in electrical communication with the second terminal at the second surface of the semiconductor die, and the at least one second solder structure directly contacts a portion of the planar metal substrate.

2. The semiconductor die package of claim 1, wherein the package has an H-bridge configuration.

3. The semiconductor die package of claim 1, wherein the semiconductor die includes two or more apertures.

4. The semiconductor die package of claim 1, further comprising two or more conductive structures overlapping the semiconductor die.

5. The semiconductor die package of claim 1, wherein the thickness of the planar metal substrate is greater than the thickness of the semiconductor die.

6. The semiconductor die package of claim 1, wherein the semiconductor die is a first semiconductor die and wherein the semiconductor die package comprises a second semiconductor die.

7. The semiconductor die package of claim 6, wherein the second semiconductor die is attached to the planar metal substrate.

8. The semiconductor die package of claim 6 wherein the first semiconductor die comprises a first vertical power MOSFET and the second semiconductor die comprises a second vertical power MOSFET.

9. The semiconductor die package of claim 1, wherein the planar metal substrate has a thickness greater than about 50 microns.

* * * * *